July 15, 1958 W. K. HOFKER 2,843,746

AMPLITUDE CONTROL FOR OSCILLATORS

Filed June 1, 1956

INVENTOR
WILLEM KOENRAAD HOFKER
BY
AGENT 2,843,746

AMPLITUDE CONTROL FOR OSCILLATORS

Willem Koenraad Hofker, Hilversum, Netherlands, assignor, by mesne assignments, to North American Philips Company, Inc., New York, N. Y., a corporation of Delaware Application June 1, 1956, Serial No. 588,889

Claims priority, application Netherlands June 2, 1955

3 Claims. (Cl. 250—36)

The invention relates to oscillator circuit arrangements having an amplifier tube provided with feed-back, the feed-back voltage being supplied to the control-grid circuit of the amplifier tube through a series-circuit which determines the oscillator frequency, a variable impedance being connected in the control-grid circuit in order to achieve amplitude control.

For a variety of practical applications, oscillator circuit arrangements are required in which the amplitude of the oscillator voltage is kept constant within narrow limits. In pilot oscillators for use in carrier-wave telephony systems, for example, the C. C. I. F. requires that the oscillator voltage remains constant with respect to the nominal amplitude level within 0.5 db. In order to ensure that the oscillator voltage does not exceed the narrow amplitude limits of 0.5 db, in such applications use is made of sensitive and hence complicated supervisory apparatus, which responds when the said 0.5 db-limit is exceeded (so-called marginal supervisory apparatus). Thus, for example, an alarm device is rendered operative and/or a reserve oscillator is switched in automatically.

It is an object of the invention to provide a particularly advantageous oscillator circuit arrangement of the kind described in the preamble, in which the above-mentioned exacting requirements with respect to amplitude constancy are satisfied.

According to the invention, the variable impedance comprises at least two series-connected rectifier cells, one end of this series combination being connected to the output circuit of a rectifier circuit arrangement connected to the oscillator output, the other end being connected to a constant reference voltage source, whilst the junction of the series-connected rectifier cells is connected to the control grid of the oscillator.

Thereby the marginal supervisory apparatus for the supervision of the oscillator circuit arrangement can be substituted by a simple supervisory apparatus.

In a preferred embodiment, the energizing winding of a supervisory relay is connected in the anode circuit for supervision of the oscillator circuit arrangement, the grid bias of the tube being constituted by a bias of fixed value and by a voltage derived from a tapping on the output circuit of the rectifier circuit arrangement connected to the oscillator output.

The invention and its advantages will now be explained in detail with reference to the figures.

Fig. 1 shows an oscillator circuit arrangement in accordance with the invention, which is stabilized in frequency by a quartz crystal 1 and can be used advantageously as a pilot oscillator in carrier-wave telephony systems.

Figure 1:
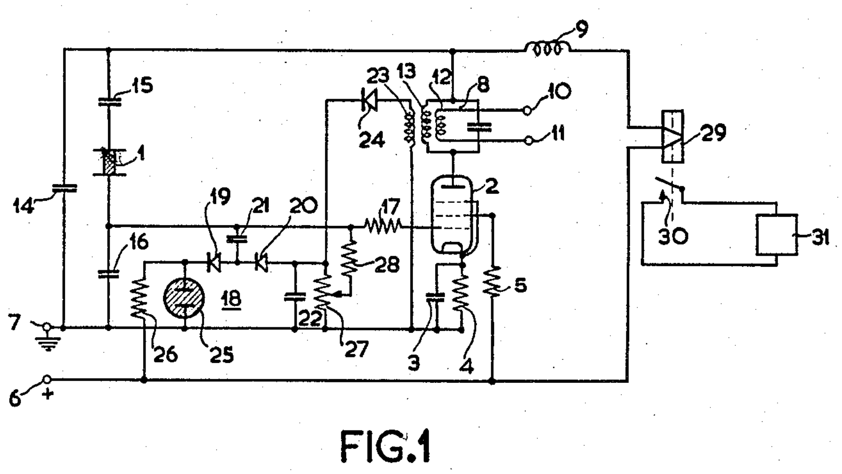
Fig. 1 shows an oscillator circuit arrangement in accordance with the invention, whilst

In the figure, reference numeral 2 designates a pentode, which is used as the oscillator and the cathode of which is connected to earth through a resistor 4 bridged by a capacitor 3, the screen-grid being connected to the positive terminal 6 of an anode voltage supply source through a resistor 5, the negative terminal of this supply source being earthed. The anode of the pentode 2 is connected to the positive terminal 6 of the anode voltage supply through the series combination of a resonant circuit 8 tuned to the oscillator frequency and of a coil 9, the oscillator voltage being taken from terminals 10, 11 of a coil 12 which is coupled to the coil 13 of the resonant circuit 8.

The feed-back circuit of the oscillator circuit arrangement, which circuit comprises a voltage divider bridged by a capacitor 14, is connected to the junction of the resonant circuit 8 and the coil 9. The voltage divider comprises the series combination of a capacitor 15, of the quartz crystal 1 and of a capacitor 16, the feed-back voltage which is derived from the junction of the crystal 1 and the capacitor 16 being supplied to the control grid of the pentode 2 through a series-resistor 17. The oscillator frequency is determined by the series resonant frequency of the quartz crystal 1, which frequency in the circuit arrangement shown is 84 kc./s.

In order to control the amplitude of the oscillator voltage in parallel to the capacitor 16 a variable impedance 18 is connected which comprises two series-connected rectifier cells 19, 20 the junction of which is connected to the control-grid of the pentode 2 through a coupling capacitor 21 and the series-resistor 17. Of these series-connected rectifier cells 19, 20 one end is connected to the output circuit 22 of a rectifier circuit arrangement 24 connected to the coil 13 through a coil 23 and the other end is connected to a constant reference voltage supply source comprising a gas-filled tube 25 which, through a resistor 26, is connected to the positive terminal 6 of the anode voltage supply source.

In the circuit arrangement described, in order to achieve amplitude control, the value of the feedback voltage is controlled by the variable impedance 18 connected in the control-grid circuit. The value of this impedance is determined by the potential difference between the output voltage of the rectifier circuit arrangement 24 and the reference voltage derived from the gas-filled tube 25, which latter voltage may, for example, be 85 volts. When the oscillator voltage increases, the difference voltage also increases, resulting in a decrease of the variable impedance 18, counteracting this increase in amplitude, which variable impedance 18 forms part of the voltage divider 15, 1, 16 connected in the feedback circuit, whereas conversely a decrease of the oscillator voltage results in an increase of the variable impedance 18, which increase counteracts the decrease of the oscillator voltage. This does not influence the working point of the oscillator tube 2, which, in the embodiment described is connected in class A.

Figure 2:
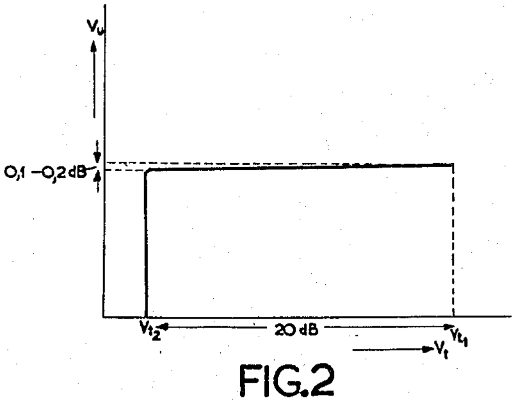
Fig. 2 shows a voltage diagram illustrating the operation of the oscillator shown in Fig. 1.

The amplitude control indicated in the oscillator circuit arrangement described is very effective, as will now be illustrated with reference to the voltage characteristic shown in Fig. 2. In the graph, the output voltage $V_u$ taken from the terminals 10 and 11 of the coil 12 is plotted as a function of the voltage $V_t$ produced across the feed-back circuit 14, 15, 1, 16, which latter voltage can be varied by variation of the mutual conductance of the tube, for example by varying the supply voltage.

When the voltage derived from the feedback circuit is reduced through a voltage range of 20 db from $V_{t1}$ to $V_{t2}$, the oscillator voltage $V_u$ decreases by 0.1 to 0.2 db only, however, on further reduction of the voltage $V_t$ the oscillator voltage $V_u$ drops substantially abruptly to zero value, for at this voltage $V_{t2}$ the oscillator suddenly stops oscillating.

Thus, it will be seen from this figure that even very large variations in the voltage $V_t$ produced in the feed-back circuit 14, 15, 1, 16 substantially do not act upon the oscillator voltage, which, however, suddenly drops to zero value at a certain limiting voltage $V_{t2}$.

To illustrate this, the dependence of the oscillator voltage $V_u$ upon variations in the supply voltage, the filament voltage, the load and the temperature, which may occur in practice, is shown below.

| | Amplitude variation, db |
|---|---|
| Supply voltage variation, 205 volts–235 volts | 0.03 |
| Filament voltage variation, 5.3 volts–7.3 volts | 0.025 |
| Load variation, 100 ohms–1200 ohms | 0.01 |
| Temperature variation, 25° C.–45° C. | 0.03 |

The oscillator frequency is not influenced appreciably by the amplitude control. The occurrence of harmonics, more particularly even harmonics, is materially reduced in the oscillator circuit arrangement described.

Owing to the fact that, when the oscillator circuit arrangement oscillates, the oscillator voltage remains constant within very narrow limits, supervision is very simple.

In order to supervise the oscillator circuit arrangement the anode circuit of the oscillator tube 2 includes the energizing winding 29 of a supervisory relay having a rest contact 30, which relay controls an alarm device 31, while a tapping on the output resistor 27 of the rectifier circuit arrangement is connected to the control grid of the oscillator tube through a resistor 28. The alarm device 31 is rendered operative by the disappearance of the oscillator voltage, for this disappearance causes the voltage at the output resistor 27 of the rectifier arrangement 24 to collapse with the result that the grid bias of the tube and hence the anode current of the tube 2 also decreases, which anode current decrease causes the supervisory relay to release and renders the alarm device 31 operative. The supervision apparatus need not satisfy exacting requirements.

It should be mentioned here that, instead of class A operation use may be made of another tube operation, for example class B or class C operation.

Finally, the most important data of the oscillator circuit arrangement shown in Fig. 1 are given below:

Pentode 2: E83F.
Rectifier cells 19, 20: OA73.
Gas-filled tube 25: 85A2.
Operating voltage: 85 v.
$L_9$: 60 mh.
$C_{14}$: 20,000 pf.
$C_{15}$: 300 pf.
$C_{16}$: 1000 pf.
Q of the crystal: 25,000.
Transformation ratio of the coils 23 and 13:2:1.

The variable resistance constituted by the rectifier cells varies approximately between 100 kohms and 500 ohms.

What is claimed is:

1. An oscillator circuit arrangement containing an amplifier tube provided with feed-back, the feed-back voltage being supplied to the control grid circuit of the amplifier tube through a series circuit determining the oscillator frequency, which control grid circuit includes a variable impedance for the provision of amplitude control, characterized in that the variable impedance comprises at least two series-connected rectifier cells, one end of this series combination being connected to the output circuit of a rectifier circuit arrangement connected to the oscillator output and the other end being connected to a constant reference voltage supply source, while the junction of the series-connected rectifier cells being coupled to the control-grid of the amplifier tube.

2. An oscillator circuit arrangement as claimed in claim 1, characterized in that the oscillator tube is connected in class A.

3. An oscillator circuit arrangement as claimed in claim 1, characterized in that, for supervision of the oscillator circuit arrangement, the anode circuit of the oscillator tube includes the energizing winding of a supervisory relay, the grid bias of the tube being constituted by a grid bias of fixed value and by a voltage taken from a tapping on the output circuit of the rectifier circuit arrangement connected to the oscillator output.

References Cited in the file of this patent

UNITED STATES PATENTS

| | | |
|---|---|---|
| 2,583,837 | Hadfield | Jan. 29, 1952 |
| 2,693,536 | Hadfield | Nov. 2, 1954 |